United States Patent [19]

Chan et al.

[11] 3,997,813
[45] Dec. 14, 1976

[54] MOS INTEGRATED CIRCUIT CHIP FOR DISPLAY PANELS

[75] Inventors: Stephen J. C. Chan, San Diego; Donald L. Henderson, Sr., Encinitas; Steven M. Baldwin, San Diego, all of Calif.

[73] Assignee: Burroughs Corporation, Detroit, Mich.

[22] Filed: Nov. 10, 1975

[21] Appl. No.: 630,218

[52] U.S. Cl. .................... 315/169 TV; 307/304; 340/324 M; 357/41
[51] Int. Cl.² ..................................... H05B 41/14
[58] Field of Search ............... 315/169 TV, 169 R; 340/324 M, 324 R, 166 EL, 173 PL; 307/297, 304; 357/41

[56] References Cited
UNITED STATES PATENTS

| | | | |
|---|---|---|---|
| 3,564,135 | 2/1971 | Weimer | 307/304 X |
| 3,668,688 | 6/1972 | Schemersal | 340/324 R |
| 3,754,161 | 8/1973 | Johnson | 315/169 R X |
| 3,862,360 | 1/1975 | Dill et al. | 315/169 TV X |

*Primary Examiner*—Eugene La Roche
*Attorney, Agent, or Firm*—G. Gregory Schivley; Mervyn L. Young; Kevin R. Peterson

[57] ABSTRACT

An MOS integrated circuit chip for both addressing and driving display devices in display panels. The chip includes low-level logic devices for receiving and manipulating data for energizing a selected number of devices in the display panel. An output driver portion is coupled to the display devices and energizes the devices in response to the data received by the input logic. The output driver portion includes a transistor in which the drain region extends deeper into the substrate than the source region of the transistor, as well as the remainder of the active regions in the integrated circuit chip. Accordingly, the integrated circuit chip can withstand a high breakdown voltage at its driver output, while also providing high density logic devices thereby minimizing discrete components and their associated separate electrical interconnections.

10 Claims, 8 Drawing Figures

| FIG.3B. | FIG.3D. |
|---|---|
| FIG.3A. | FIG.3C. |

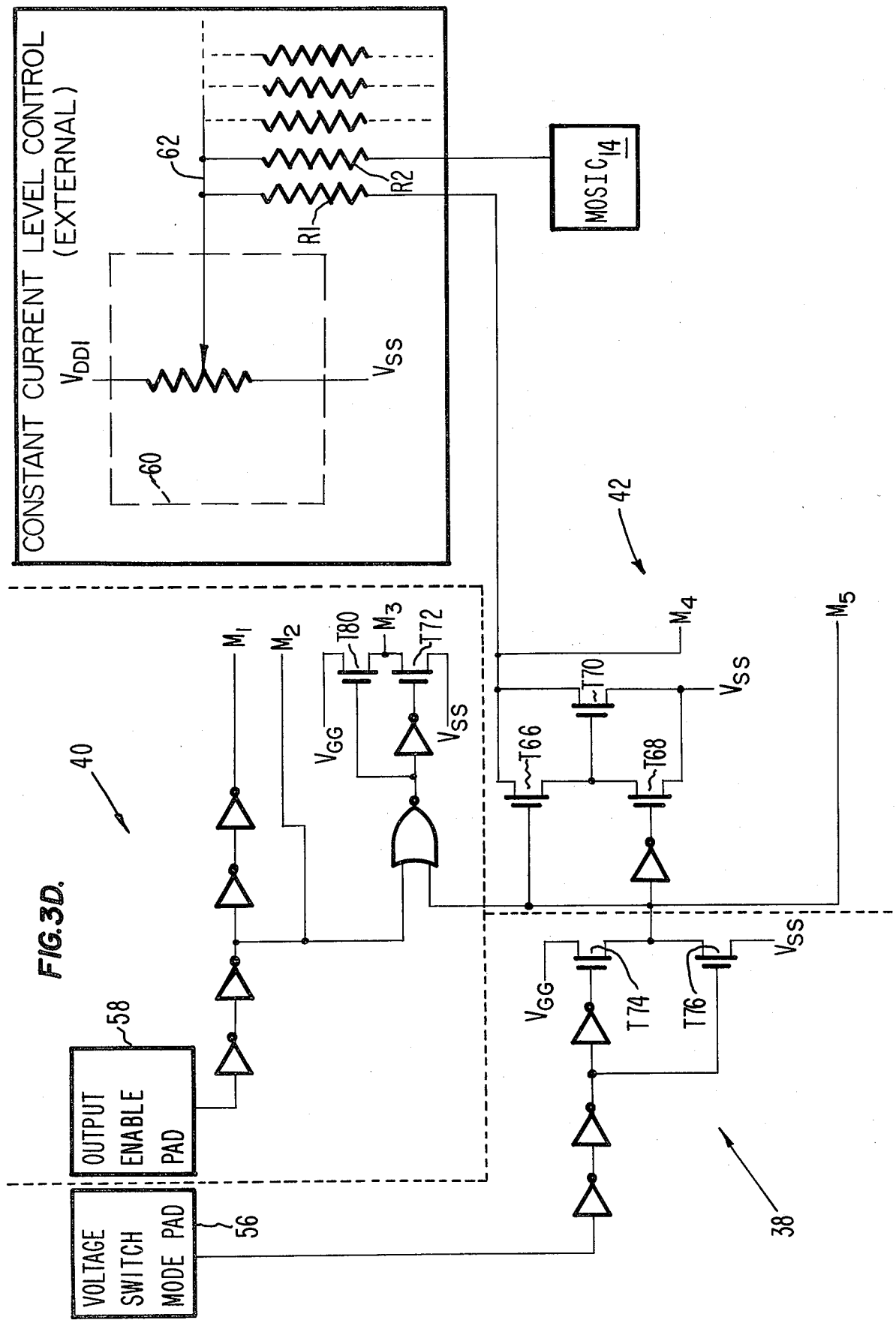

MOS INTEGRATED CIRCUIT CHIP FOR DISPLAY PANELS

CROSS REFERENCE TO RELATED APPLICATIONS

This application is related to U.S. Ser. No. 630,198, entitled "Uniform Current Level Control For Display Panels," by Stephen Chan, having the same filing date and assignee as the present invention.

Background of the Invention

This invention relates to display panels. More particularly, it relates to an MOS integrated circuit chip for both addressing and driving display devices in the panel.

Display panels having a plurality of gas filled cells within the body of the panel has been available commercially for sometime. One such device is known as the SELF-SCAN panel display which is described in U.S. Pat. No. 3,875,475 Ogle et al. Another gas discharge display device is the PANAPLEX panel display which is a multiple position gas discharge device having a plurality of segmented display cathodes and associated anode electrodes located in a common envelope. Both the SELF-SCAN and PANAPLEX panel displays are sold commercially by Burroughs Corporation.

The SELF-SCAN display panel includes a matrix of individual display cells filled with a gas which will provide a glow of ionization. The display panel includes several character rows for display alphanumeric characters. Each character row is comprised of seven rows of individual cells or display devices. Each character row includes a plurality of crossing electrodes for supplying a relatively high energization voltage and current to a selected number of cells to ionize the gas therein and cause a glow discharge.

Display driver circuits are used to control the energization current to the display devices. Such driver circuits are interfacing arrangements between the source of control information and the display devices. In most instances, it is desirable to perform certain addressing logic functions, such as storage, synchronization, and other manipulations, on the incoming data before it is transferred to the output drivers to energize th display devices. The output drivers have generally been discrete power output transistors coupled to a suitable electrode on its display device. These output driver transistors must be capable of withstanding high voltages when they are turned off. In the SELF-SCAN display system the output drive should have a minimum breakdown voltage of about 140 volts. Heretofore, specially designed discrete bipolar power output transistors with high breakdown voltages have been used for such purposes.

MOS (metal-oxide-semiconductor) technology provides excellent high density and low cost processing characteristics. Consequently, it would be advantageous to use an MOS chip to perform not only the low level logic operations for the display system but also to drive the display devices. Heretofore, such as integrated circuit chip has not been available. It has been suggested in U.S. Pat. No. 3,811,071 Ogle to take advantage of the economies of MOS technology by using MOS transistors for addressing the display devices. However, bipolar transistors with high breakdown voltages are still needed to drive the display devices. In fact, a regulator means are needed to insure that the MOS transistors, themselves, are not subjected to the high supply voltage for the display devices. It would considerably simplify the design of the system to be able to drive, as well as address, the display devices without including extraneous regulator means to insure that the supply voltage does not deleteriously destroy the MOS devices.

It would also be advantageous to provide an integrated circuit chip which would minimize the number of electrical connections. In most instances, there has been one data input for each display device. There are seven display devices or cells in each character row for the SELF-SCAN display. Substantial savings could be obtained if there is required but only one data input for the entire character row. In such manner, the electrical interconnections could then be minimized, with their corresponding cost savings.

Objects and Summary of the Invention

Therefore, it is an object of this invention to provide an MOS integrated circuit chip for driving display panels that can withstand high breakdown voltages, while also providing high density low level logic devices on the same chip for selectively addressing the display devices.

It is a further object of this invention to accomplish the above objective without the use of extraneous regulator means for isolating the MOS devices from the high voltages used in the energization systems for the display devices in the panel.

It is a further object of this invention to provide an MOS integrated circuit chip which minimizes the number of electrical connections in the addressing/-driving system for a display panel.

These and other objects of the invention are provided by an MOS integrated circuit chip including low-level logic devices for receiving and manipulating data for energizing a selected number of display devices in the panel. A driver circuit controls the glow discharge in the devices in response to appropriate signals relayed by the input logic. The driver circuit has an output transistor which can be coupled to the supply voltage for energizing the display devices. The drain region of the output transistor extends deeper into the substrate than the source region of the output transistor, as well as deeper than the active regions in the remainder of the integrated circuit chip. The output transistor thus provides a high voltage breakdown for the chip and protects the remainder of the devices on the chip from ruinous effects of the high supply voltage used in ionizing the gas in the display devices. In a preferred embodiment, the chip includes but one data input receiving means for all of the display devices in a character row for the display panel. Data is received by the data input means and shifted serially into shift registers corresponding to the number of display devices. Means are also included to transfer the data from the shift registers, in parallel, to corresponding latch circuits when the shift registers are full of information. Each latch circuit is coupled to a corresponding output driver which in turn is coupled to its corresponding row of display devices. The data in the latch circuits turns the output drivers on or off depending upon whether the subject display devices are to be energized or not. Shift and latch clock pulse generators are also provided on the chip to regulate the transfer of data in the shift registers and latches.

BRIEF DESCRIPTION OF THE DRAWINGS

FIGS. 3A, 3B, 3C and 3D show schematic diagrams of portions of the MOS integrated circuit chip shown in FIG. 2;

DESCRIPTION OF THE PREFERRED EMBODIMENT

The MOS integrated circuit chip of the present invention will be described in connection with a SELF-SCAN display panel. SELF-SCAN display panels are sold commercially by Burroughs Corporation. The operation of the SELF-SCAN display panel is described in U.S. Pat. No. 3,875,474 Ogle et al and U.S. Pat. No. 3,654,508 Caras which are assigned to the same assignee as the present invention. These patents can be referred to for a more detail description of the operation of the display panel 10. It should be understood however that the chip of this present invention can be used in other types of display panel systems which require high voltages to drive them. Another type of display panel may be the PANAPLEX display panel sold by Burroughs Corporation.

Briefly, the SELF-SCAN display panel 10 includes a plurality of character rows for displaying alphanumeric characters. Each character row is composed of a matrix of gas discharge cells or display devices containing an ionizable gas. In this embodiment, there are seven rows of display devices in each character row. Each display device includes a cathode electrode and anode electrode for supplying energization voltage and current thereto to ionize the gas thereby causing a glow in the display device. Selected numbers of the display devices are energized to form the desired alphanumeric characters. Display driver logic 12 supplies the necessary information to the MOS IC chips 14 of the present invention to drive the desired display devices in panel 10. Display driver logic 12 is thus a source of data in bit form which will provide necessary electronic signals to the driver circuits which will enable them to energize the desired display devices in order to form characters in the panel 10. Display driver logic 12 can be supplied, for example, by a memory bank of a computer.

Figure 1:
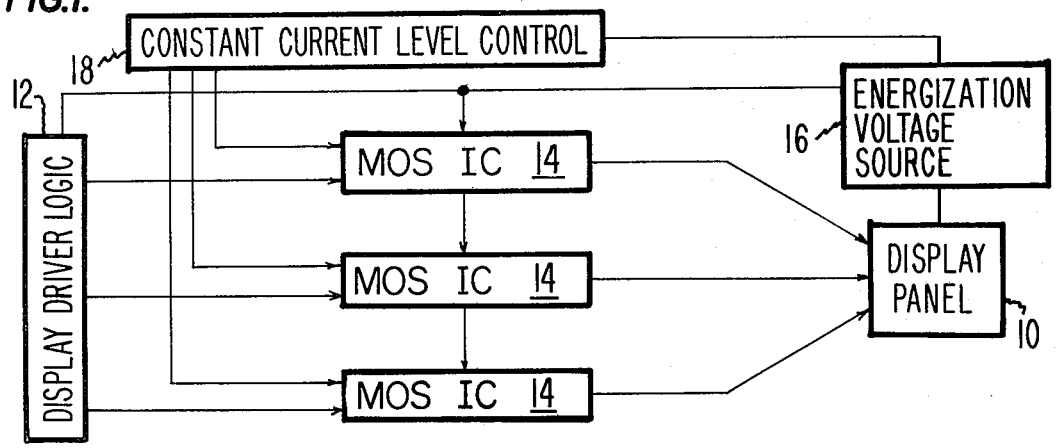
FIG. 1 is a block diagram of a display panel system in which the MOS integrated circuit chip of the present invention finds particular utility.

In the preferred embodiment there is one MOS IC chip 14 for every character row in display panel 10. Consequently, if there is only one character row there only need be but one chip 14. However, in the SELF-SCAN display there are several character rows. Therefore, in FIG. 1 there is shown three chips 14 corresponding to three character rows in display panel 10. Each chip 14, however, must regulate the control of all of the display devices in each character row. In the SELF-SCAN display there are seven cells or display devices in each character row. As noted before, each display device includes electrodes which provide energization voltage and current thereto to ionize the gas in the cell. Energization voltage source 16 provides this ionization voltage. Voltage source 16 supplies approximately 250 volts between the electrodes of each display device during energization. Driver portions on chip 14 act as a current source or switch to supply energization current to selected devices. In order to energize a display device the voltage source 16 must supply the needed energization voltage and the driver portion of chip 14 must be conducting to supply current to the device. In this embodiment the driver portions of chip 14 are coupled to the anode electrodes for the display devices as noted in U.S. Pat. No. 3,875,474 Ogle et al. If desired, the chips 14 can be coupled to the cathode electrodes. When the display device is not to be energized, the driver portion of the chip 14 is nonconducting or turned off and is subjected to a high breakdown voltage. In the SELF-SCAN display system it is necessary for the output driver of driver circuit 14 to be capable of withstanding breakdown voltages of at least 140 volts. For a better understanding of SELF-SCAN display systems reference may be had to Burroughs display systems Bulletin Nos. S102D, S101B, and S104C. It would be desirable to provide an IC chip which performs certain low level logic functions as well as providing an output drive capable of withstanding such voltages. The MOS integrated circuit chips 14 of the present invention provides all the necessary logic and output driving functions for each character row in display panel 10.

It is desirable to control the brightness of each display device in display panel 10. If there are several character rows in display panel 10 there will be a corresponding number of chips 14. Due to the various fabrication parameters, each chip 14 may have slightly different characteristics. Therefore, the display devices in each character row may differ in brightness from the other character rows in display panel 10. Constant current level control 18, including external portions as well as internal portions on chip 14, provides a means by which all of the display devices in every character row will be of uniform brightness regardless of the varying characteristics of the chips 14 which energize them.

Figure 2:
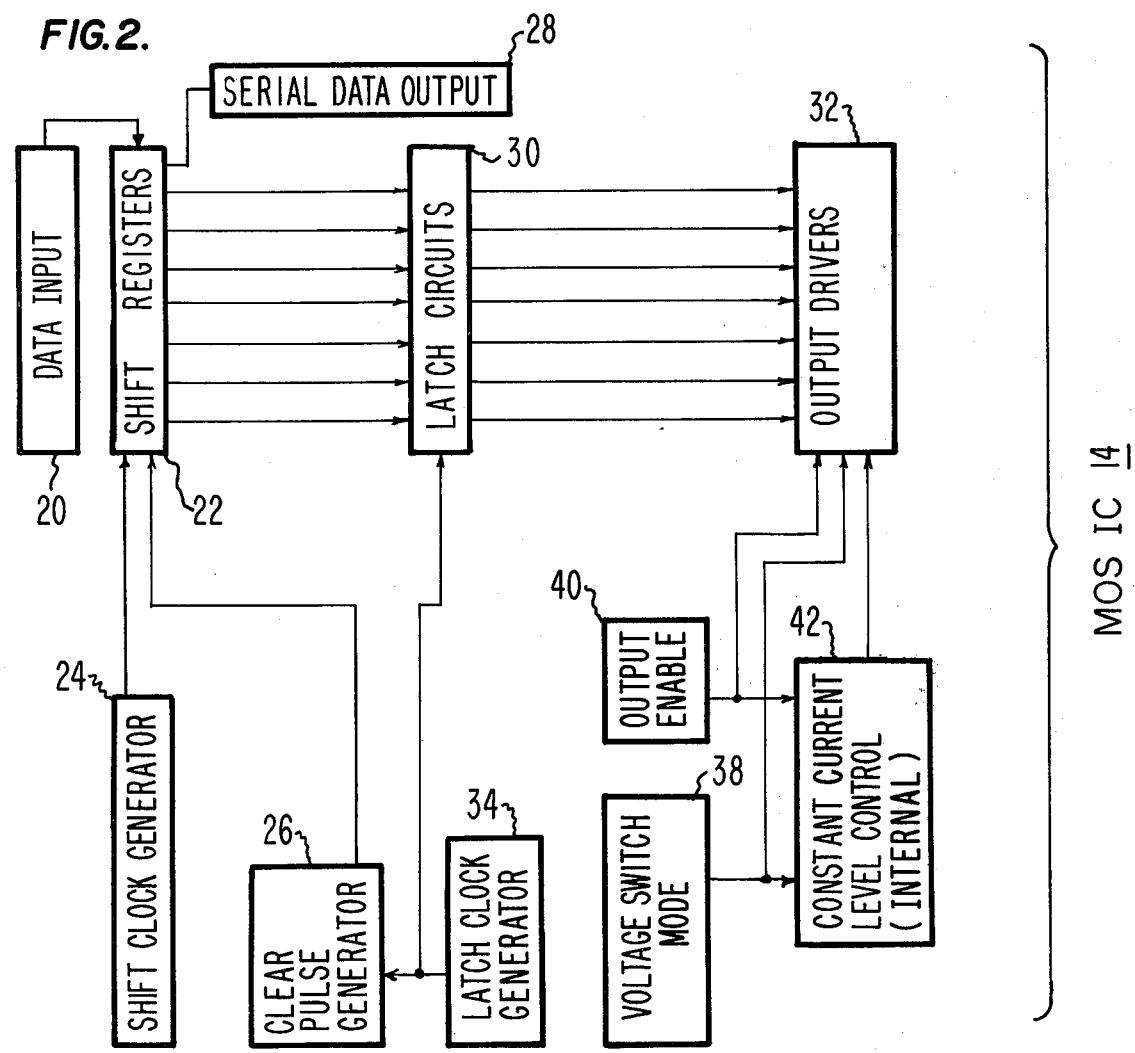
FIG. 2 is a block diagram of a preferred embodiment of the MOS integrated circuit chip of the present invention.

FIG. 2 shows a block diagram of one embodiment of the MOS IC chip 14 of the present invention. Chip 14 is fabricated in monolithic integrated circuit chip form using MOS (metal-oxide-semiconductor) technology. By an MOS integrated circuit chip we mean to include chips utilizing various types of surface field effect transistors, for example, silicon gate transistors, metal-insulator-semiconductor (MIS) devices having various insulators such as silicon nitride, etc. In the preferred embodiment, the MOS IC chips 14 are P-channel devices. The integrated circuit chip 14 includes low-level logic devices such as inverters, NOR gates, etc., which are also composed of transistors having source, gate, and drain regions. By low-level logic devices we mean those devices operating with a drain-source voltage, $V_{DS}$, of less than 50 volts. It is a feature of this invention that the chip 14 also includes an output driver portion capable of withstanding breakdown voltages of a minimum of 140 volts. In P-channel MOS devices, the source and substrate are generally at the same potential. The source potential, $V_{SS}$, is more positive than the drain voltage, $V_{DD}$. The transistor will turn on or conduct between the source and drain upon applying a voltage at the gate, $V_{GG}$, which is more negative than $V_{SS}$. For purposes of this invention, such a voltage will be referred to as LOW signal, whereas a signal which will turn the transistor off will be referred to as HIGH signal. It should be noted, however, that the integrated circuit chip of this invention can be fabricated using N-channel MOS technology, in which corresponding voltage conventions would be used.

FIG. 2 shows a block diagram of the MOS IC chip 14. Data input 20 receives the data or information from display driver logic source 12. In the preferred embodiment there is only one data input 20 for each chip 14 which, in turn, regulates seven display devices in this embodiment. Consequently, only one data input pad is needed on the chip to receive data for driving a plurality of display devices. While there are seven display devices in the SELF-SCAN display, the number can be varied as desired. Data input 20 receives data in bit serial form from the display driver logic source 12. The data is transferred serially into seven series connected shift registers 22. There is one shift register for every display device to be driven. Clock pulses from the shift clock generator 24 synchronize the transfer of data into the shift registers 22. Clear pulse generator 26 provides a pulse to clear the shift registers 22 after data has been transferred to latch circuits 30.

Shift registers 22 include a serial data output 28 which can provide data to similar integrated circuit chips 14. Serial data output 28 provides a feature by which data can, if desired, be entered at only one data input in the system and be transferred to all of the chips 14 in the system for driving a plurality of character display rows.

When all of the shift registers 22 have been loaded with data, the data is transferred in parallel to latch circuits 30. Latch clock generator 34 regulates the timing of this transfer of data to the latch circuits 30. This data in latch circuits 30 control the output drivers 32. There is one output driver for each row of display devices in display panel 10. In this embodiment there are seven rows of display devices and consequently, there are seven output drivers 32. An appropriate signal from latch circuits 30 will either turn the output drivers 32 on or off. The data in latch circuits 30 control all seven output drivers 32 simultaneously. Consequently, output drivers 32 regulate the energizaton of all the rows of display devices at the same time.

Voltage switch mode 38 enables the output drivers 32 to deliver their maximum current to their respective display devices. Output enable 40 provides a means by which the output drivers 32 may be turned off without affecting the data stored in latch circuits 30. The internal constant current level control portion 42 on the chip cooperates with an external current level control circuit to provide uniform brightness of the display devices 36. The constant current level control external from the integrated circuit chip 14 as will be discussed hereinafter. Current control 42 is coupled to the output drivers 32 which drive each character row in display panel 10. The constant current control regulates the current flow in output drivers 32 to insure that the brightness of all of the display devices in each character row are uniform regardless of varying chip characteristics.

Figures 3, 3A:
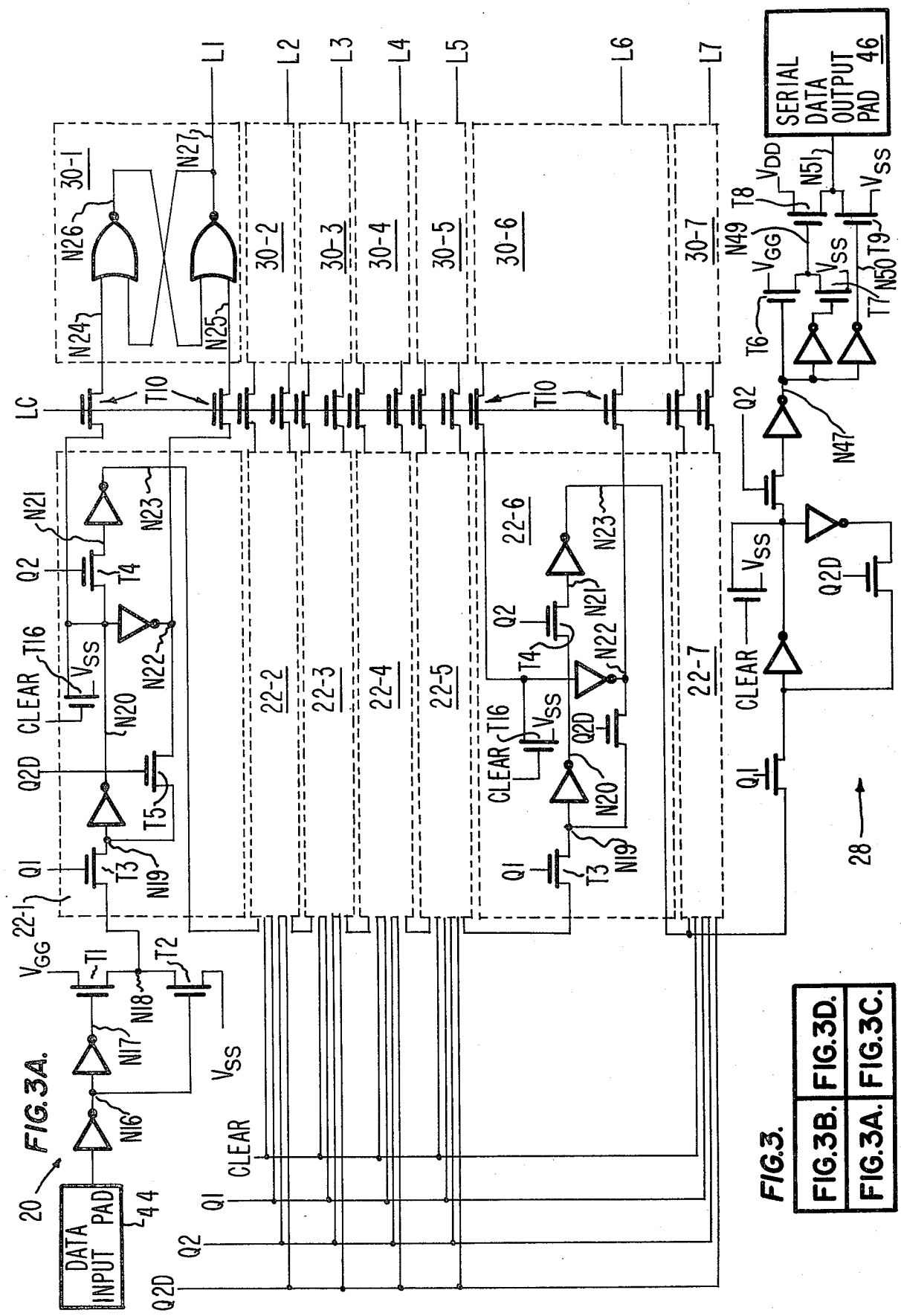

FIG. 3A shows a schematic diagram of the data input 20, shift registers 22, serial data output 28, and latch circuits 30. Data input 20 receives data from display driver logic 12 in bit serial form. The first bit of data will determine whether display device 7 (see FIG. 3C) will be turned on or off. Similarly, the second bit of data will determine whether display device 6 will be turned on or off, and so forth. This is because the data, although received in serial form, is shifted downward into each shift register 22-1 through 22-7 until all seven of them are filled. A HIGH signal at data input pad 44 of data input 20 results in a LOW signal at N16 and a HIGH signal at N17. The HIGH signal turns transistor T1 off while the LOW signal at transistor T2 turns it on. Consequently, N18 is raised to $V_{SS}$, which is a HIGH signal. The pulses at Q1, Q2 and Q2D and CLEAR are generated by the shift, latch, and clear clock generators 24, 34, and 26, respectively, shown in detail in FIG. 3B. When Q1 is LOW, Q2 and Q2D are HIGH. A LOW signal at Q1 turns on transistor T3 thus transferring the HIGH signal at N18 to N19. N20 consequently goes LOW and N22 goes HIGH due to the associated inverters.

At the next time period, Q1 goes HIGH and Q2 and Q2D becomes LOW. Transistor T4 is consequently turned on thus providing a LOW at N21 and a HIGH at N23. N23 is fed into the next serially connected shift register 22-2. N19 is maintained at the same data level as that at data input pad 44 until new data is entered. This is because N19 is held at a HIGH level when Q2D becomes LOW. Hence, everytime a cycle is completed (i.e. Q1, Q2 and Q2D go LOW once) one bit of data is shifted down to the following register. This process is continued until the bottommost shift register 22-7 is filled with data. Hence, it can be seen that if the first bit of data entering data input 20 is HIGH, it will produce a HIGH at N22 of the bottommost shift register 22-7. If the next bit of data is a LOW at data input 20, the shift register 22-6 will produce a LOW at N22, that signal, along with its inverse N20, being used to control the output drivers 32.

Serial data output 28 is connected in parallel to the last shift register 22-7. In other words, the same data inputted to shift register 22-7 is inputted into the circuit connected to serial data output pad 46. N47 will be at the same potential as N23 of shift register 22-7 since the preceeding portion of the serial data output circuit corresponds to the shift registers 22. A HIGH at N47 will correspond to a HIGH at N23. A HIGH at N47 will turn off transistor T6, while turning on transistor T7, thus producing a HIGH at N49. A HIGH at N49 turns transistor T8 off. N50, however, will be LOW in response to a HIGH at N47. Consequently, T9 will be turned on thus producing a HIGH at N51. Therefore, it can be seen that N51 provides the same signal as N23 in the last shift register 22-7. Serial data output 28 may be used, if desired, to provide data in serial form to a second chip 14. The data coming out of output pad 46 will be the input to the second chip 14. In such manner, data can be shifted from one chip to another while utilizing only one data input 20 on the first chip. The circuit portion downstream from N47 provides capability for driving the subsequent chips.

In this embodiment there are seven shift registers 22. Consequently, all of the shift registers 22 will be filled with data after every seven shift clock pulses. During Q2 of the seventh clock pulse, a LOW signal is generated at LC by latch clock generator 34. LC is connected to the gates of parallel connected transistors T10. Transistors T10 provide transfer means for transferring data in all of the shift registers 22 to latch circuits 30. Data at N20 and N22 in each of the shift registers 22 are transferred to their corresponding latch circuits 30. N20 will always be the inverse of N22. When N20 is LOW, for example, N22 is HIGH. When transferring transistors T10 are conducting in response to a LOW LC signal, N24 will be at the same signal level as N20, and N25 will be at the same signal level as N22. Continuing this example, N24 will be LOW and N25 will be HIGH. This condition will produce a HIGH signal at N26 and a LOW signal at N27. Consequently, it can be seen that a HIGH signal at data input pad 44 will produce a LOW signal at the designated output, L1–L7, of latch circuits 30. It is an important feature of this invention even though the data is entered into shift registers 22 serially, they are shifted simultaneously, in parallel, to latch circuits 30.

Figure 3B:
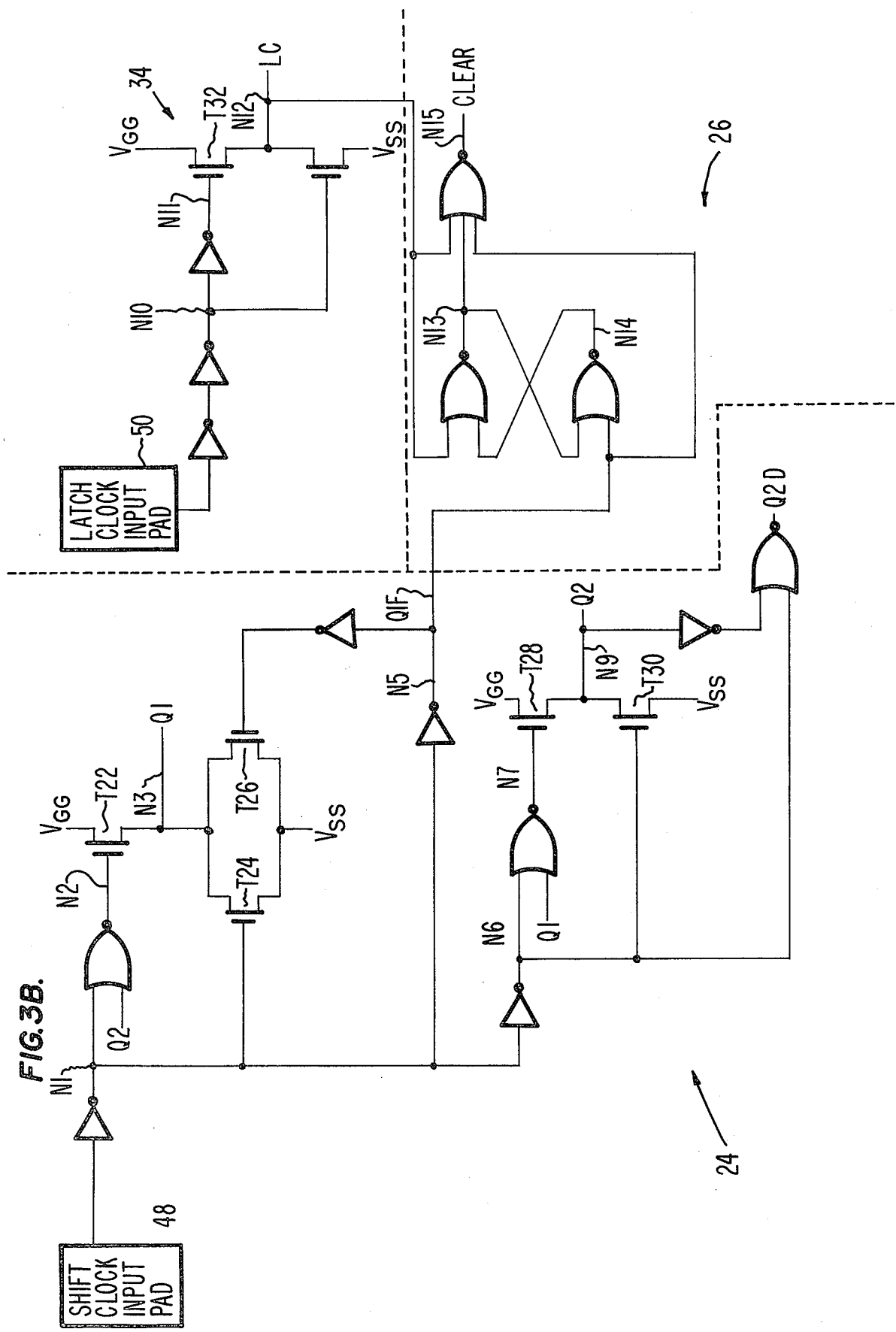
Figure 3C:
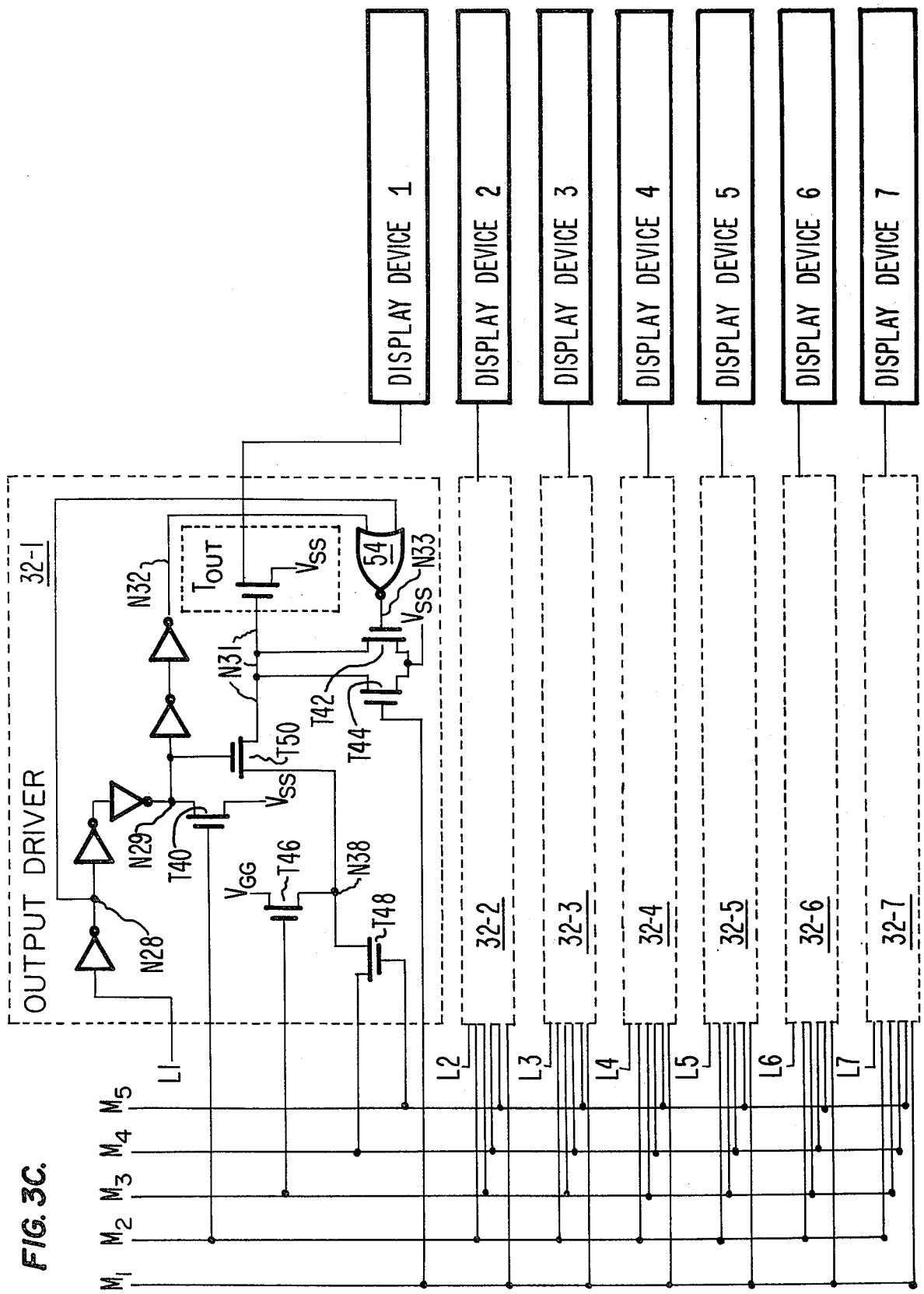

The outputs L1 through L7 provide the inputs for output drivers 32 shown in FIG. 3C. A LOW signal at L1 produces a HIGH at N28. This is turn produces a HIGH at N29 and a HIGH at N32. The two HIGH inputs N28 and N32 at NOR gate 54 produces a LOW at N33. A LOW at N33 turns transistor T42 on thus raising the voltage at N31 to $V_{SS}$ or a HIGH. This HIGH signal at the gate of transistor $T_{OUT}$ turns it off. When transistor $T_{OUT}$ is off, its corresponding display device is not energized because no current is supplied to the display device. Hence, it can be seen that a HIGH signal in shift register 20-1 turns its corresponding output transistor $T_{OUT}$ off, thus suppressing glow in its corresponding display devices. Conversely, a LOW data input in shift register 22-1 will turn transistor $T_{OUT}$ on and create a glow in display device 1, since transistor $T_{OUT}$ is conducting thereby providing ionization current to the display devices. This same interaction occurs between the remainder of the output drivers 32. In the same manner, they will either energize or suppress glow in their respective display devices in response to the appropriate signal in their corresponding latch circuits 30. After the data in latch circuits 30 have been transferred to transistor $T_{OUT}$ as just described, the latch clock generator 34 will provide a HIGH at LC to prevent further data from entering the latches 30 until the shift registers 22 are full of new data. When LC returns to a HIGH level, a negative clear pulse is provided at T16 (see FIG. 3A) to clear the data in all of the shift registers 22 to permit new entry of data into the shift registers 22.

FIG. 3B shows a schematic diagram of the shift clock generator 24, latch clock generator 34 and the clear pulse generator 26. Shift clock 24 produces a four phase pulse output Q1, Q1F, Q2 and Q2D in response to an input pulse applied to the shift clock input pad 48. Three of those phases, Q1, Q2, and Q2D are coupled to shift registers 22. A LOW pulse at shift clock pad 48 produces a HIGH at N1, and a LOW at N2, thus turning on transistor T22. When T22 is on, it produces a LOW at N3 thus providing a LOW output at Q1. A LOW is also produced at N5 which occurs prior to the LOW at Q1 since there is only one gate delay between N1 and N5. Therefore, Q1F, which is equal to N5, will have the same voltage level as Q1; however, it will occur one gate delay before Q1.

The HIGH at N1 produces a LOW at N6 thereby turning on transistor T30 and creating a HIGH at N9. A HIGH at N9 produces a HIGH pulse for Q2. It will also produce a HIGH at Q2D. However, Q2D will be delayed approximately two gate delays from Q2. Therefore, it can be seen that a LOW entered at shift clock input pad 48 produces a LOW at Q1 and Q1F, and a HIGH at Q2 and Q2D. Analogously, when shift clock input pad is at a HIGH, Q1 and Q1F goes HIGH, and Q2 and Q2D go LOW. Shift clock generator 24 insures that Q1F goes LOW prior to Q1, and that Q2D goes LOW subsequent to Q2.

Latch clock generator 34 produces a LOW pulse at LC after every seven shift clock pulses in order to transfer the data into latches 30 after all of the shift registers 22 are filled. A HIGH input at latch clock input pad 50 produces a HIGH at N10. The HIGH at N10 produces a LOW at N11, turning on transistor T32 thereby producing a LOW at N12. Thereby, a LOW LC pulse is provided for every HIGH latch clock pulse. Conversely, a LOW input at latch clock input pad 50 produces a HIGH at LC.

A LOW clear pulse from clear pulse generator 26 is needed to clear the data in the shift registers after transfer of data to the latches 30 and before new data is entered into the shift registers 22. In the SELF-SCAN display system, the shift clock input must be inhibited for one bit time in order to provide time to form the clear pulse of sufficient duration to clear the shift registers 22. The input to latch clock pad 50 is regulated so that it does not produce a HIGH (resulting in a LOW at LC) while the shift clock generator 24 produces a LOW (thus resulting in a LOW at Q1). A HIGH at N12 (LC) and a LOW at Q1F produces a LOW at N13 and a HIGH at N14. N15 is thus HIGH. After Q1F returns to HIGH, N13 stays LOW, and N15 stays at a HIGH level. When LC goes LOW and Q1F stays HIGH, N13 goes HIGH, N14 goes LOW, and N15 stays at a HIGH level. However, when LC returns to a HIGH, N15 goes LOW until Q1F returns to a LOW level. Then N15 returns to a HIGH. Thus, a LOW clear pulse is generated after a LOW LC pulse. The LOW clear pulse resets the shift registers 30 so that it can receive new data. Clear pulse returns to a HIGH position prior to entry of new data via Q1 since Q1F is produced faster than Q1.

Referring now to FIG. 3D, the MOS IC chip 14 of the present invention also includes features which permit it to be used in various operation modes. For example, it can be used in a voltage switch mode 38 which enables $T_{OUT}$ in output drivers 32 to deliver its maximum current to the display devices. The MOS IC chip 14 can also be used in an output enable or blanking mode which provides the ability to turn off $T_{OUT}$ thereby inhibiting glow in the display devices without affecting the data stored in latch circuits 30.

If the voltage switch mode is desired, a LOW signal is applied to the voltage switch mode input pad 56. Consequently, M5 goes HIGH and M4 goes LOW. The potential at M4 depends upon the position of the moving arm of the potentiometer 60 in the external constant current level control. If the signal at the output enable pad 58 is HIGH at this time, then M1 and M2 are also HIGH. Since M5 is HIGH, M3 is LOW. Transistor T46 in output driver 32-1 is this turned on. N38 reaches its most negative voltage with respect to the $V_{GG}$ voltage at the source of T46. In the event that the data from latches 30 sets N29 at a LOW level, then the voltage at N31 will reach its maximum voltage as at N38. Consequently, transistor $T_{OUT}$ delivers its maximum current possible to the display devices.

If a HIGH input is applied to the output enable pad 58, M1 and M2 go HIGH. The condition of M3, M4, and M5 depend upon the signal level at voltage switch mode pad 56. Transistors T40 and T44 in the output driver 32 are off. The condition of $T_{OUT}$ reflects the data stored in the corresponding latch circuit 30. For instances, when L1 is HIGH, N28, N29, and N30 are LOW, with N33 being HIGH. Transistors T42 and T44 are off, T50 is on, N31 is LOW, and $T_{OUT}$ is turned on.

If a LOW input is applied to the output enable pad 58, M1 and M2 go LOW, with M3 being HIGH. There is no effect on M4 and M5 because they are not controlled by the signal at output enable pad 58. Consequently, T46 is turned off, T40 and T44 are turned on. N29 and N32 are HIGH, with N33 being LOW. T42 is also turned on, and N31 becomes HIGH. As a consequent, $T_{OUT}$ is turned off regardless of the data stored in the latch circuit 30. In other words, the output enable mode 40 does not affect the data stored in the latch circuits 30 while permitting the display devices to be turned off. It should be noted that the output enable mode 40 is not used when selecting the voltage switch mode 38 or constant current mode. In normal operation, the signal level at output enable pad 58 is high.

It is a feature of this invention that the MOS IC driver chip 14 can also be used in a constant current source. If so desired, the signal at voltage switch mode pad 56 is set at a HIGH level. The constant current mode of operation is extremely advantageous when more than one character row is included in the display panel 10. In such instance, a plurality of chips 14 are used, one each to drive each character row for the display panel 10. It is foreseeable that each chip 14 may have slightly different characteristics if they are fabricated at different times under nonexact processing conditions. While the function of the chips 14 remain the same, it is possible that their threshold voltage levels, for example, may differ from chip to chip. Similarly, the current at a specific threshold voltage may differ from chip to chip due to differences in gate oxide thickness, the substrate material, mobility of the charge carriers, etc. These different chip characteristics may create non-uniform brightness in the display devices of the different character rows. However, the constant current level control feature of the present invention provides a means by which uniform brightness of the display devices can be obtained regardless of differing characteristics on the various chips.

Figure 5:
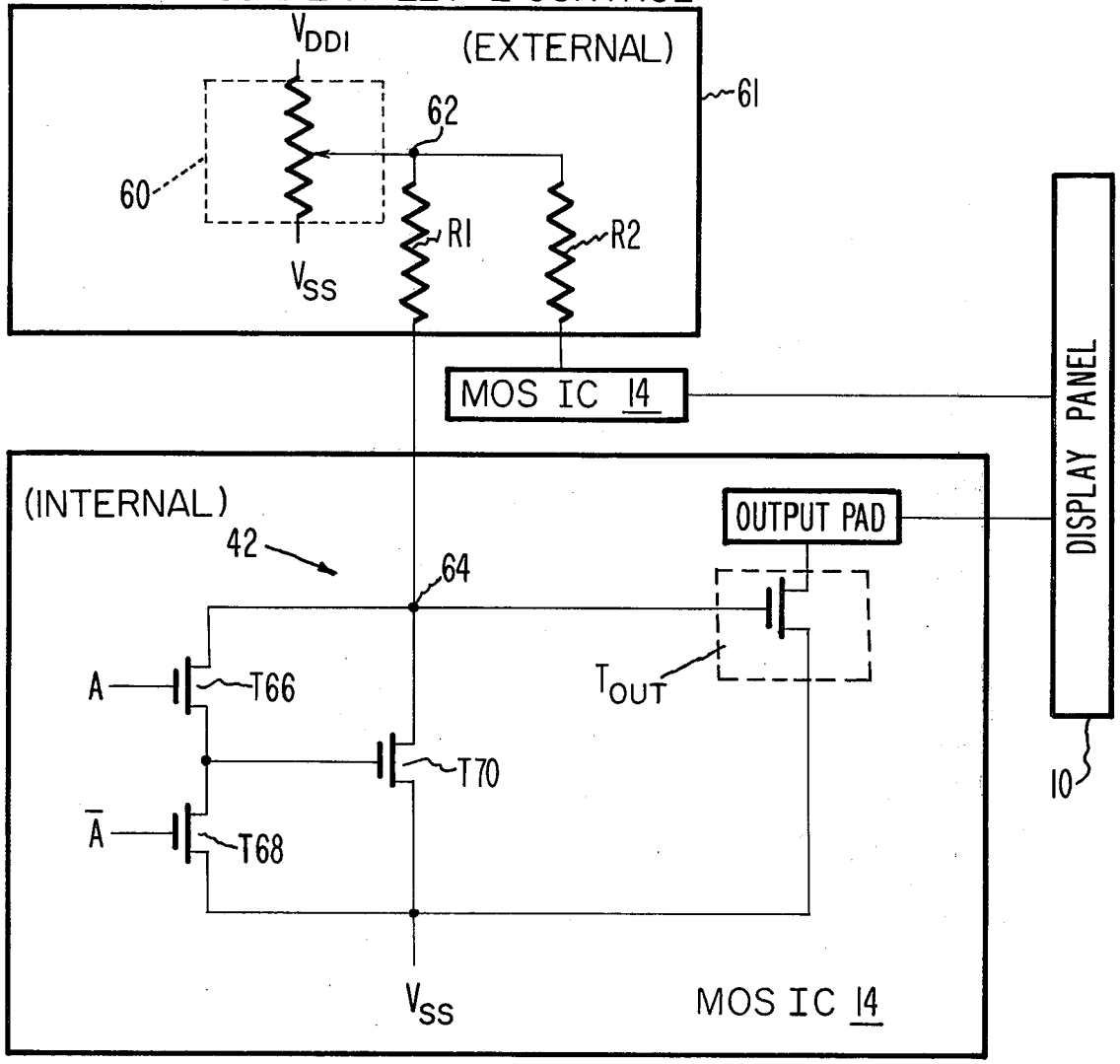
FIG. 5 shows a schematic diagram of one embodiment of a constant current level control for the display panel.

FIG. 3D shows the constant current level control feature cooperating with the voltage switch mode 38 and output enable mode 40 features as described above. For ease of description, the constant current level control will be described with reference to FIG. 5 which eliminates these other features for better illustrating this aspect of the invention. The constant current level control includes passive elements external of the chip 14 which cooperate with internal control elements on the chip 14. In the external portion, a variable resistor 60 is coupled between a voltage source at one end supplying a voltage, $V_{DD1}$, and at the other end to a voltage source supplying a source voltage, $V_{SS}$. For P-channel MOS devices, $V_{DD1}$, must be more negative than $V_{SS}$. The moving arm of the variable resistor 60 is connected to one node 62 of a plurality of resistors having equal value. The number of resistors correspond to the number of individual chips 14. For ease of illustration there is shown in FIG. 5 only two chips 14. Consequently, there is shown only two resistors, R1 and R2. The other end of each of the resistors are coupled to a node 64 on each of their respective chips 14. The voltage supply and resistors provide a variable voltage source 61. Variable voltage source 61 is external to the chip 14. Once the moving arm of the variable resistor 60 is set, it supplies a brightness control voltage to node 64 on each of the chips 14. While this voltage can be varied, it will always be more negative than the source voltage (for P-channel MOS transistors). Transistors T66, T68, T70, and $T_{OUT}$ are all fabricated on the same chip. Consequently, they all have the same characteristics such as the aforementioned threshold voltage, gate oxide thickness, etc. Node 64 is coupled to the gate of transistor $T_{OUT}$. It should be noted that other devices can be coupled between node 64 and the gate of $T_{OUT}$ as long as they do not change the voltage level therebetween. Reference to FIG. 3D wll show that node 64 of FIG. 5 corresponds to M4 of FIG. 3D.

The drain of T70 and the drain of T66 are coupled to node 64. The gate of T70 is coupled to the drain of T68 and source of T66. The sources of T68, T70, and $T_{OUT}$ are all connected to $V_{SS}$. A LOW signal (A) at the gate of transistor T66 will turn it on. The voltage at node 64 from variable voltage source 61 is chosen so that the LOW signal at the gate of T66 is at least one threshold level more negative than the voltage at node 64. Consequently, source voltage of T66 will be the same as the drain voltage when the transistor T66 is conducting and T68 is off. The input to transistor T68 is the inverse ($\bar{A}$) of the input to transistor T66. Consequently, a HIGH input is provided at the gate of transistor T68 when there is a LOW input at the gate of transistor T66. The HIGH input at T68 turns the transistor off. A LOW input at T68 and a HIGH at T66 will turn T70 off thereby disenabling the constant current mode.

The gate of transistor T70 is coupled to the source of transistor T66. Consequently, the potential at the drain and gate of T70 will be the same when T66 is conducting, as is the case when the constant current mode is selected. The negative potential derived from the source of T66 when it is turned on also turns on T70. After the conduction of T70 stabilizes, the drain and gate of T70 will be at the same potential. The voltage between the source and drain of the transistor T70, however, will be different. The difference in voltage developed between the source and drain of T70 will be determined by R1 and the source-drain inpedance of transistor T70 which, in turn, is a function of the internal characteristics of the transistor. The drain and source of T70 are coupled across the gate and source of transistor $T_{OUT}$, respectively. The threshold voltage of all of the transistors are the same since they are fabricated in the same chip. Similarly, the K' of the transistors are the same. K' is defined as $$K' = u_p \frac{E_{ox}}{t_{ox}}$$

where,
  $u_p$ = mobility of charge carriers;
  $E_{ox}$ = gate oxide dielectric constant;
  $t_{ox}$ = thickness of gate oxide.
The current in the transistor T70 is represented by the equation $$I = \tfrac{1}{2}(K')(W/L)(V_{GS}-V_T)^2$$

where,
  $V_{GS}$ = gate-source voltage;
  $V_T$ = threshold voltage;
  $W$ = channel width;
  $L$ = channel length.
Consequently, the current and therefore the impedance in the transistors is a function of the internal device characteristics, for example, threshold voltage $V_T$, K', thickness of the gate oxide, etc.

When T70 has a low threshold voltage or a high K', or a combination of both, the impedance between the source and drain of T70 becomes relatively low as a function thereof. Consequently, the device tends to permit more current to go through it at a fixed drain voltage. If the impedance is low due to these factors, the voltage differential between the source and drain of T70 is proportionally lower. Since the drain of T70 is coupled to the gate of $T_{OUT}$ a correspondingly lower voltage will appear at the gate of $T_{OUT}$. The low gate voltage at $T_{OUT}$ produced by the low impedance of T70 compensates for the effect of a low threshold voltage or high K' for the transistor $T_{OUT}$. In such manner, the voltage at the gate of transistor $T_{OUT}$ is varied by the voltage developed between the drain and source of T70 in order to maintain a uniform current throughout all of the transistors, $T_{OUT}$, in all of the chips. If the threshold voltage is relatively high, coupled with a low K', there will be an increased amount of impedance between the source and drain of transistor T70 thereby producing an increased amount of voltage at the gate of $T_{OUT}$ which, in turn, increases the current therein. This same compensation affect occurs throughout all of the individual chips 14. Consequently, even if the chips have different characteristics, uniform brightness can be obtained throughout the several character rows in the display panel since the current at the output driver transistors will be uniform.

Figure 4:
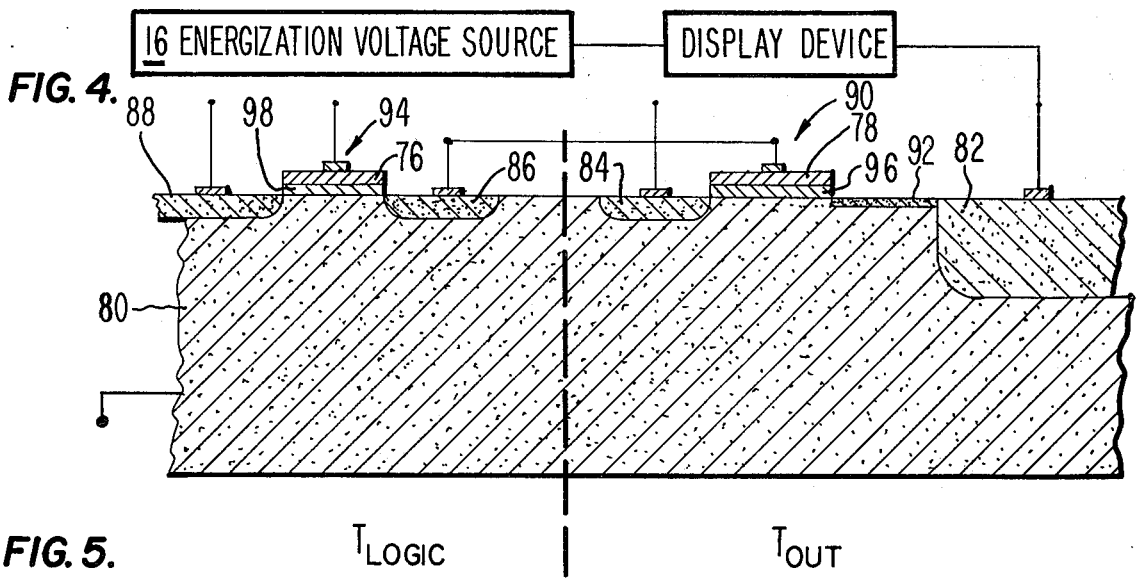
FIG. 4 is a partial cross sectional view of one embodiment of the MOS integrated circuit chip of the present invention.

Reference should now be had to the physical construction of the monolithic MOS IC chip 14 as shown in FIG. 4. In the SELF-SCAN display, the driver circuit portion is used to control the anode electrode of each of the display devices. The current through the driver is modulated at various levels between a very low level which is insufficient to render the display devices visible and a very high level which is sufficient to produce a very bright glow discharge. In order to produce this glow discharge, the voltage source must also supply an energizaton voltage between the electrodes of the display devices. The drain of the transistor $T_{OUT}$ is coupled to the one electrode of the display device. An external resistor (not shown) may be serially connected between the drain and display device for power dissipation purposes. When the transistor $T_{OUT}$ is off, it must be capable of withstanding a minimum breakdown voltage of about 140 volts. Heretofore, the most commercially feasible method of driving such display devices was to use a discrete specially designed bipolar transistor for the output driver. These discrete transistors were specially designed to withstand such a high breakdown voltage. Unfortunately, the fabrication techniques to make these devices were not compatible with the techniques used to provide high speed low level logic devices. Hence, the logic devices were fabricated on different chips than the high voltage output driver. This meant of course that the logic devices were packaged separately from the output drivers, with external coupling circuits connecting them together. In contrast, the MOS IC chip of the present invention includes both low-level logic devices and a drive device which is capable of withstanding breakdown voltages of at least 140 volts.

FIG. 4 shows the MOS IC integrated chip of the present invention which includes both logic devices, designated as $T_{LOGIC}$, and an output driver device, designated at $T_{OUT}$. In this example, the chip 14 includes an N-type silicon substrate 80 having a resistivity of 3.5–5.5 ohm-centimeter. The chip 14 includes a drain region 82 and source region 84 for transistor $T_{OUT}$ which are fabricated on substrate 80. The low level logic device $T_{LOGIC}$ (only one of which is shown in FIG. 4) include drain region 86 and source region 88 which are also fabricated on the same substrate 80. The drain region 82 for transistor $T_{OUT}$ extends at least three times deeper into the substrate 80 than the remaining active regions on the chip, i.e. the source 84 for transistor $T_{OUT}$ and the source 88 and drain 86 of the transistor $T_{LOGIC}$. In this example, the drain region 82 extends approximately 10 microns into substrate 80. In contrast, the remaining active regions extend only approximately 1.6 microns into substrate 80. The drain region 82 is of P-type conductivity and has a surface concentration of approximately $1 \times 10^{19} cm^{-3}$. Similarly, the remaining active regions on chip 14 are also of P-type conductivity and have a surface concentration of approximately $8 \times 10^{19} cm^{-3}$. The transistor $T_{OUT}$ includes gate region 90 having a conductive field plate portion 78 and a gate oxide layer 96. Analogously, the logic devices, $T_{LOGIC}$, have a gate region 94 including a conductive field plate 76 and gate oxide layer 98. To further enhance the breakdown voltage of the drain region 82, it is offset from the gate region 90 by a shallow ion implantation region 92 of P-type conductivity. In this example, region 92 is approximately 600–700 Å thick. Region 92 effectively connects drain region 82 to a region in substrate 80 under the influence of gate region 90. It is necessary that the drain region 82 for transistor $T_{OUT}$ extend deeper into the substrate 80 than the remaining active regions therein in order to obtain a higher breakdown voltage at transistor $T_{OUT}$ than for the remaining low level logic devices. We have discovered that with the drain region 82 extending at least three times deeper into substrate 80 than the remaining active regions, it is insured that the transistor $T_{OUT}$ will have a minimum breakdown voltage of 140 volts. Since these active regions are much more shallow than the drain region 82, a high density integrated circuit chip can be obtained having relatively high speed, etc. These active regions are not subjected to the high breakdown voltage as is drain 82 which is coupled to the display devices. The drain region 82 of $T_{OUT}$ can withstand the high voltage from energization voltage source 16 and thus isolate the remainder of the chip 14 from deleterious breakdown. The chip 14 of the present invention can be made using well known MOS processing techniques. Drain region 82 can be formed in a first deep diffusion process. Then, the remaining active region of the chip 14 can be produced in a subsequent diffusion process. If region 92 is desired, it can be formed using well-known ion implantation techniques. The gate regions 90, 94 and interconnection metallization patterns (shown merely as lines in FIG. 4) can then be fabricated using standard techniques.

In view of the above, it can now be realized that the MOS integrated circuit chip of the present invention provides both high density low level logic devices and an output driver device which can withstand high breakdown voltages encountered in driving display devices. In this embodiment, the logic devices perform storage functions, clock functions, etc. However, other types of logic functions, such as calculating functions, can also be provided on the chip. Therefore, from the foregoing description it can be realized that the long felt need in the display panel industry for a chip which will perform both low level logic functions and drive display devices has been fulfilled. It should be understood that while this invention has been described in connection with a particular example thereof, no limitation is intended thereby except as defined in the appended claims.

We claim:

1. A monolithic MOS integrated circuit chip for both selecting and driving display devices requiring high energization voltages, said chip comprising:
   low-level logic circuit means for selecting display devices for energization, said logic means including transistors with a source region, gate region, and drain region fabricated on a semiconductur substrate;
   driver circuit means for energizing the display devices selected by said logic means, said driver means having an output transistor with a source region, gate region, and drain region fabricated on said substrate, said drain region of said output transistor extending deeper into said substrate than the source region of said output transistor as well as the source and drain regions of said logic means, wherein said drain region provides a high breakdown voltage for the output transistor on said chip; and
   said chip providing both high density low-level logic devices for selecting the display devices and an output driver capable of withstanding high breakdown voltages encountered in energization systems for said display devices.

2. The MOS integrated circuit chip of claim 1 wherein said low-level logic circuit means comprises:
   data input means for receiving data containing information or selectively energizing said display devices; and
   means for transferring the data from said input means to said driver circuit means.

3. The MOS integrated circuit chip of claim 1 wherein the drain of the output transistor is offset from the gate thereof, said drain being connected to a region in the substrate directly below the gate by a shallow region of the same conductivity type as the drain.

4. A monolithic MOS integrated chip for both addressing and driving a plurality of display devices requiring high energization voltages, said integrated circuit chip comprising:
   1. low-level logic circuit means for addressing said display devices for energization, said logic means including transistors with source, gate and drain regions fabricated on a semiconductor substrate, said logic means having:
      data input means for receiving data, said data containing information for energizing a selected number of said display devices;
      a plurality of serially connected shift registers, one each for each display device;
      means for serially transferring data from said input means into said shift registers;
      a plurality of latch means corresponding to the number of said shift registers;
      means for transferring, in parallel, data from said shift registers into said latches when the shift registers are filled with data;
      means for transferring said data, in parallel, from said latches to driver circuit means;
   2. a plurality of driver circuit means for energizing said display devices in response to data from said latch means; each of said driver circuit means having:
      a plurality of output transistors corresponding to the number of display devices, each of said transistors having source, gate, and drain regions fabricated on said substrate, said drain region extending deeper into said substrate than said source region of said output transistor as well as the source and drain regions of said logic means, wherein said drain region provides a high breakdown voltage for said chip,
      whereby said chip provides both high density low-level devices for addressing said display devices and an output driver capable of withstanding the high voltages encountered in energization systems for said display devices.

5. The MOS integrated circuit chip of claim 4 wherein said low-level circuit means further comprises:
   shift clock generator means for providing clock pulses to regulate the transfer of data on said shift registers, and a latch clock generator means for supplying a pulse upon completion of data transferral into said shift registers, said latch clock means being coupled to said means for transferring data from said shift registers to said latch means whereby said latch clock means activates said transferring means when the shift registers are full.

6. The MOS integrated circuit chip of claim 5 wherein said shift clock generator means provides at least a three phase output.

7. The MOS integrated circuit chip of claim 6 wherein each of said shift registers include three transistors each being coupled to one phase of said shift clock output phases to regulate transfer of data in said shift registers.

8. The MOS integrated circuit chip of claim 4 wherein the drain of the output transistor is offset from the gate thereof, said drain being connected to a region in the substrate directly below the gate by a shallow region of the same conductivity type as the drain.

9. The MOS integrated circuit chip of claim 4 wherein said substrate is of N-type conductivity, with the source and drain regions therein being of P-type conductivity.

10. The MOS integrated circuit chip of claim 4 wherein the drain region of said output transistor extends at least three times deeper into said substrate than the source region thereof as well as the source and drain regions of said logic means providing a minimum breakdown voltage of approximately 140 volts.

* * * * *

UNITED STATES PATENT OFFICE
CERTIFICATE OF CORRECTION

Patent No. 3,997,813            Dated December 14, 1976

Inventor(s) Stephen J. C. Chan et al.

It is certified that error appears in the above-identified patent and that said Letters Patent are hereby corrected as shown below:

Col. 1, line 21, change "3,875,475" to read --3,875,474--.
Col. 1, line 30, change "glow of" to read --glow upon--.
Col. 1, line 45, change "th display" to read --the display--.
Col. 1, line 51, change "output drive" to read --output driver--.
Col. 1, line 61, change "such as" to read --such an--.
Col. 4, line 25, change "drive capable" to read --driver capable--.
Col. 7, line 15, change "This is turn" to read --This in turn--.
Col. 8, line 55, change "is this" to read --is thus--.
Col. 8, line 68, change "instances," to read --instance,--.
Col. 10, line 40, change "inpedance" to read --impedance--.

Col. 14, line 25, change "low-level circuit" to read --low-level logic circuit--.
Col. 14, line 56, change "means providing" to read --means thereby providing--.

Signed and Sealed this

First Day of March 1977

[SEAL]

Attest:

RUTH C. MASON
Attesting Officer

C. MARSHALL DANN
Commissioner of Patents and Trademarks